(12) United States Patent
Seifert et al.

(10) Patent No.: US 7,354,850 B2
(45) Date of Patent: Apr. 8, 2008

(54) DIRECTIONALLY CONTROLLED GROWTH OF NANOWHISKERS

(75) Inventors: Werner Seifert, Lund (SE); Lars Ivar Samuelson, Malmö (SE); Björn Jonas Ohlsson, Malmö (SE); Lars Magnus Borgström, Eindhoven (NL)

(73) Assignee: QuNano AB, Lund (SE)

( * ) Notice: Subject to any disclaimer, the term of this patent is extended or adjusted under 35 U.S.C. 154(b) by 39 days.

(21) Appl. No.: 11/049,293

(22) Filed: Feb. 3, 2005

(65) Prior Publication Data

US 2006/0019470 A1 Jan. 26, 2006

Related U.S. Application Data

(60) Provisional application No. 60/541,949, filed on Feb. 6, 2004.

(51) Int. Cl.
*H01L 21/28* (2006.01)

(52) U.S. Cl. ........................ 438/604; 977/825

(58) Field of Classification Search ................ 438/604, 438/606, 607, 930, 584; 977/915, 825
See application file for complete search history.

(56) References Cited

U.S. PATENT DOCUMENTS

| | | | |
|---|---|---|---|
| 5,196,396 A | 3/1993 | Lieber | |
| 5,252,835 A | 10/1993 | Lieber et al. | |
| 5,332,910 A | 7/1994 | Haraguchi et al. | |
| 5,362,972 A | 11/1994 | Yazawa et al. | |
| 5,381,753 A | 1/1995 | Okajima et al. | |
| 5,544,617 A | 8/1996 | Terui et al. | |
| 5,840,435 A | 11/1998 | Lieber et al. | |
| 5,858,862 A | 1/1999 | Westwater et al. | |
| 5,897,945 A | 4/1999 | Lieber et al. | |
| 5,899,734 A | 5/1999 | Lee | |
| 5,976,957 A | 11/1999 | Westwater et al. | |
| 5,997,832 A | 12/1999 | Lieber et al. | |
| 6,130,142 A | 10/2000 | Westwater et al. | |
| 6,130,143 A | 10/2000 | Westwater et al. | |
| 6,159,742 A | 12/2000 | Lieber et al. | |

(Continued)

FOREIGN PATENT DOCUMENTS

EP 0 443 920 8/1991

(Continued)

OTHER PUBLICATIONS

Hiruma et al., Self-organized growth of GaAs/InAs hetrostructure nanocylinders by organometallic vapor phase epitaxy, Journal of Crystal Growth, 163, 226-231, (1996).*

(Continued)

*Primary Examiner*—Brook Kebede
(74) *Attorney, Agent, or Firm*—Foley & Lardner LLP

(57) ABSTRACT

Nanowhiskers are grown in a non-preferential growth direction by regulation of nucleation conditions to inhibit growth in a preferential direction. In a preferred implementation, <001> III-V semiconductor nanowhiskers are grown on an (001) III-V semiconductor substrate surface by effectively inhibiting growth in the preferential <111>B direction. As one example, <001> InP nano-wires were grown by metalorganic vapor phase epitaxy directly on (001) InP substrates. Characterization by scanning electron microscopy and transmission electron microscopy revealed wires with nearly square cross sections and a perfect zincblende crystalline structure that is free of stacking faults.

44 Claims, 4 Drawing Sheets

U.S. PATENT DOCUMENTS

| | | | |
|---|---|---|---|
| 6,190,634 | B1 | 2/2001 | Lieber et al. |
| 6,286,226 | B1* | 9/2001 | Jin ............................ 33/706 |
| 6,307,241 | B1 | 10/2001 | Awschalom et al. |
| 6,322,713 | B1* | 11/2001 | Choi et al. .................... 216/38 |
| 6,340,822 | B1 | 1/2002 | Brown et al. |
| 6,559,468 | B1 | 5/2003 | Kuekes et al. |
| 6,586,965 | B2 | 7/2003 | Kuekes |
| 6,716,409 | B2 | 4/2004 | Hafner et al. |
| 6,743,408 | B2 | 6/2004 | Lieber et al. |
| 7,014,737 | B2* | 3/2006 | Harutyunyan et al. ... 204/158.2 |
| 2002/0129761 | A1 | 9/2002 | Takami |
| 2002/0130311 | A1 | 9/2002 | Lieber et al. |
| 2002/0172820 | A1* | 11/2002 | Majumdar et al. .......... 428/357 |
| 2002/0175408 | A1 | 11/2002 | Majumdar et al. |
| 2003/0089899 | A1 | 5/2003 | Lieber et al. |
| 2003/0121764 | A1 | 7/2003 | Yang et al. |
| 2003/0200521 | A1 | 10/2003 | DeHon et al. |
| 2004/0213307 | A1 | 10/2004 | Lieber et al. |

FOREIGN PATENT DOCUMENTS

| | | |
|---|---|---|
| EP | 0 838 865 | 4/1998 |
| EP | 1 314 189 | 5/2003 |
| EP | 1 342 075 | 9/2003 |
| JP | 2000-068493 | 3/2000 |
| WO | WO 95/02709 | 1/1995 |
| WO | WO 97/31139 | 8/1997 |
| WO | WO 01/03208 | 1/2001 |
| WO | WO 01/77726 | 10/2001 |
| WO | WO 01/84238 | 11/2001 |
| WO | WO 02/01648 | 1/2002 |
| WO | WO 02/080280 | 10/2002 |
| WO | WO 03/005450 | 1/2003 |
| WO | WO 03/053851 | 7/2003 |
| WO | WO 03/063208 | 7/2003 |
| WO | WO 2004/010552 | 1/2004 |
| WO | WO 2004/038767 | 5/2004 |

OTHER PUBLICATIONS

Hiruma et al., "GaAs free-standing quantum-size wires," Journal of Applied Physics, vol. 74, No. 5, Sep. 1, 1993, pp. 3162-3171.*

Sato et al., "Site-controlled growth of nanowhiskers," Applied Physics Letters, vol. 66, No. 2, Jan. 9, 1995, pp. 159-161.*

Björk et al., "One-dimensional hetrostructures in semiconductor nanowhiskers," Applied Physics Letters, vol. 80, No. 6, Feb. 11, 2002, pp. 1058-1060.*

Yazawa, M. et al, "Heteroepitaxial Ultrafine Wire-Like Growth of InAs on GaAs Substrates", Applied Physics Letters, Mar. 11, 1991, pp. 1080-1082, vol. 58, No. 10.

Haraguchi, K. et al., "GaAs p-n junction formed in quantum wire crystals", Applied Physics Letters, Feb. 10, 1992, pp. 745-747, vol. 60, No. 6.

Yazawa, M., et al., "Effect of one monolayer of surface gold atoms on the epitaxial growth on InAs nanowhiskers", Applied Physics Letters, Oct. 26, 1992, pp. 2051-2053, vol. 61.

Yazawa, M., "Nanocolumns composed of GaAs-InAs jointed whiskers and SiO2 covers", Applied Physics Letters, Aug. 29, 1994, pp. 1157-1158, vol. 65.

Sato, T., "Site-controlled growth of nanowhiskers", Applied Physics Letters, Jan. 9, 1995, pp. 159-161, vol. 66.

Hiruma, K., et al., "Growth and optical properties of nanometerscale GaAs and InAs whiskers", Applied Physics Review, Jan. 15, 1995, pp. 447-462, vol. 77.

Hiruma, K., et al., "Growth and Characterization of Nanometer-Scale GaAs, AiGaAs and GaAs/InAs Wires", IEICE Trans. Electron., Sep. 1, 1994, pp. 1420-1425, vol. E77-C, No. 9.

Hiruma, K., et al., "Gas free-standing quantum-size wires", Journal of Applied Physics, Sep. 1, 1993, pp. 3162-3171, vol. 74.

Haraguchi, K., et al., "Polarization dependence of light emitted from GaAs p-n junctions in quantum wire crystals", Journal of Applied Physics, Apr. 15, 1994, pp. 4220-4225, vol. 75.

Hiruma, K., et al., Self-organized growth of GaAs/InAs heterostructure nanocylinders by organometallic vapor phase epitaxy, Journal of Crystal Growth, Jan. 1, 1996, pp. 226-231, vol. 163.

Lieber, C., "Nanowires as Building Blocks for Nanoscale Science and Technology", Abstracts of Papers of the Amer. Chem Soc., Aug. 18, 2002, pp. 033-Camp Part 1, vol. 224.

Duan, X. et al., "Laser Assisted Catalytic Growth of Single-Crystal Compound Semicondcutor Nanowires", Abstracts of Papers of- the Amer. Chem. Soc., Mar. 26, 2000, pp. 676-Inor Part 1, vol. 219.

Duan, X. et al., "Laser Assisted Catalytic Growth of Semiconductor Nanowires for Nanoscale Electronic Optoelectronic Device Application", Abstracts of Papers of- the Amer. Chem. Soc., Apr. 1, 2001, pp. 644-Inor Part 1, vol. 221.

Lieber, C., "Semiconductor Nanowires: Building Blocks for Nanoscale Science and Technology", Abstracts of Papers of- the Amer. Chem. Soc., Aug. 1, 2001, pp. 383-Phys Part 2, vol. 222.

Huang, Y., et al., "Integrated Optoelectronics Assembled from Semiconductor Nanowires", Abstracts of Papers of- the Amer. Chem. Soc., Aug. 18, 2002, pp. 039-Phys Part 2, vol. 224.

Hu, J. et al., "Chemistry and Physics in One Dimension: Synthesis and Properties of Nanowires and Nanotubes", Acc. Chem. Res., Feb. 20, 1999, pp. 435-445, vol. 32, No. 5.

Duan, X. et al., "General Synthesis of Compound Semiconductor Nanowires", Advanced Materials, Jan. 1, 2000, pp. 298-302, vol. 12, No. 4.

Duan, X., et al., "Synthesis and optical properties of gallium arsenide nanowires", Applied Physics Letters, Feb. 28, 2000, pp. 1116-1118, vol. 76, No. 9.

Cui, Y., et al., "Diameter-controlled synthesis of single-crystal silicon nanowires", Applied Physics Letters, Apr. 9, 2001, pp. 2214-2216, vol. 78, No. 15.

Gudiksen, M.S., et al., "Diameter-selective synthesis of semiconductor nanowires", J. Am. Chem. Soc., Aug. 22, 2000, pp. 8801-8802, vol. 122.

Gudiksen, M.S., et al., "Size-Dependent Photoluminescence from Single Indium Phosphide Nanowires", Journal of Physical Chemistry B, Mar. 30, 2002, pp. 4036-4039, vol. 106, No. 16.

Duan, X., et al., "Laser-Assisted Catalytic Growth of Single Crystal GaN Nanowires", Journal of Amer. Chem. Soc., Dec. 18, 1999, pp. 188-189, vol. 122, No. 1.

Huang, Y., et al., "Gallium Nitride Nanowire Nanodevices", Nano Letters, Jan. 11, 2002, pp. 81-82, vol. 2, No. 2.

Lieber, C., "Nanowire Sugerlattices", Nano Letters, Jan. 25, 2002, pp. 82-82, vol. 2, No. 2.

Duan, X., et al., "Nonvolatile Memory and Programmable Logic from Molecule-Gated Nanowires", Nano Letters, May 1, 2002, pp. 487-490, vol. 2, No. 5.

Cui, Y., et al., "High Performance Silicon Nanowire Field Effect Transistors", Nano Letters, Jan. 1, 2003, pp. 149-152, vol. 3, No. 2.

Zhong, Z., et al., "Synthesis of P-Type Gallium Nitride Nanowires for Electronic and Photonic Nanodevices", Nano Letters, Feb. 20, 2003, pp. 343-346, vol. 3, No. 3.

Hu, J., et al., "Controlled Growth and Electrical Properties of Heterojunctions of Carbon Nanotubes and Silicon Nanowires", Nature, May 6, 1999, pp. 48-51, vol. 399.

Duan, X., et al., "Indium phosphide nanowires as building blocks for nanoscale electronic and optoelectronic devices", Nature, Jan. 4, 2001, pp. 66-69, vol. 409.

Gudiksen, M.S., et al., "Growth of nanawire superlattice structures for nanoscale photonics and electronics", Nature, Feb. 7, 2002, , pp. 617-620, vol. 415.

Lauhon, L., et al., "Epitaxial Core-Shell and Core-Multishell Nanowire Heterostructures", Nature, Nov. 7, 2002, pp. 57-61, vol. 420, No. 6911.

Duan, X., "Single-nanowire electrically driven lasers", Nature, Jan. 16, 2003, pp. 241-244, vol. 421.

Lieber, C., "The incredible shrinking circuit", Sci. Am., Sep. 1, 2001, pp. 58-64, vol. 285.

Morales, A., et al., "A Laser Ablation Method for the Synthesis of Crystalline Semiconductor Nanowires", Science, Jan. 9, 1998, pp. 208-211, vol. 279.

Cui, Y., et al., "Functional Nanoscale Electronic Devices Assembled Using Silicon Nanowire Building Blocks", *Science*, Feb. 2, 2001, pp. 851-853, vol. 291.

Wang, J., et al., "Highly Polarized Photoluminesence and Photodetection from Single Indium Phosphide Nanowires", *Science*, Aug. 24, 2001, pp. 1455-1457, vol. 293, No. 5534.

Cui, Y., et al., "Nanowire nanosensors for highly sensitive and selective detection of biological and chemical species", *Science*, Aug. 17, 2001, pp. 1289-1292, vol. 293.

Huang, Y., et al., "Logic Gates and Computation from Assembled Nanowire Building Blocks", *Science*, Nov. 9, 2001, pp. 1313-1317, vol. 294.

Cui, Y., et al., "Doping and Electrical Transport in Silicon Nanowires", *The Journal of Physical Chemistry B*, May 11, 2000, pp. 5213-5216, vol. 104, No. 22.

Gudiksen, M.S., et al., "Synthetic Control of the Diameter and Length of Single Crystal Semiconductor Nanowires", *The Journal of Physical Chemistry B*, Apr. 18, 2001, pp. 4062-4064, vol. 105.

Morales, A., et al., "Rational Synthesis of Silicon Nanowires", *INOR*, 651, Jan. 1, 2001.

Wong, E., et al., "Nanobeam Mechanics: Elasticity, Strength, and Toughness of Nanorods and Nanotubes", *Science*, Sep. 26, 1997, pp. 1971-1975, vol. 277.

Dai, H., et al., "Synthesis and Characterization of Carbide Nanorods", *Nature*, Jun. 29, 1995, pp. 769-772, vol. 375.

Junno, T., et al., "Controlled manipulation of nanogarticles with an atomic force microscope", *Applied Physics Letters*, Jun. 26, 1995, pp. 3627-3629, vol. 66.

Zwiller, V., et al., "Single quantum dots emit single photons at a time: Antibunching experiment", *Applied Physics Letters*, Apr. 23, 2001, pp. 2476-2478, vol. 78, No. 17.

Borgstrom, M., et al., "High peak-to-valley ratios observed in InAs/InP resonant tunneling quantum dot stacks", *Applied Physics Letters*, May 21, 2001, pp. 3232-3234, vol. 78, No. 21.

Thelander, et al., "Gold manoparticle single-electron transistor with carbon nanotube leads", *Applied Physics Letters*, Sep. 24, 2001, pp. 2106-2108, vol. 79, No. 13.

Ohlsson, B.J., et al., "Size-, Shape-, and position-controlled GaAs nono-whiskers", *Applied Physics Letters*, Nov. 12, 2001, pp. 3335-3337, vol. 79, No. 20.

Bjork, M.T., et al., :One-dimensional heterostructures in semiconductor nanowhiskers, *Applied Physics Letters*, Feb. 11, 2002, pp. 1058-1060, vol. 80, No. 6.

Persson, M.P . et al., "Electronic Structure of Nanometer-Scale GaAs Whiskers", *Applied Physics Letters*, Aug. 12, 2002, pp. 1309-1311, vol. 81, No. 7.

Thelander, C., et al., "Single-Electron Transistors in Heterostructure Nanowires", *Applied Physics Letters* , Sep. 8, 2003, pp. 2052-2054, vol. 83, No. 10.

Panev, N., et al., "Sharp Exciton Emission From Single InAs Quantum Dots in GaAs Nanowires", *Applied Physics Letters* , Sep. 15, 2003, pp. 2238-2240, vol. 83, No. 11.

Bjork, M.T., "Nanowire resonant tunelling diodes", *Applied Physics Letters*, Dec. 2, 2002, pp. 4458-4460, vol. 81, No. 23.

Persson, A., "Oriented Growth of InAs-based Nanowhiskers", *Diploma Work, Lund Institute of Technology, Lund University*, May 29, 2001, pp. 1-48.

Ohlsson, J., "Semiconductor Hetero- and Nanostructures", *Doctoral Thesis, Lund Institute of Technology, Lund University*, Nov. 23, 2001.

Thelander, C., "Quantum Devices from the Assembly of Zero-and One-Dimensional Building Blocks", *Doctoral Thesis, Lund University*, Nov. 7, 2003.

Ohlsson, B., et al., "Anisotropic GaAs island phase grown on flat Gap: A stranski-Krastanow-formed corrugated surface", *Journal of Applied Physics*, May 15, 2001, pp. 5726-5730, vol. 89, No. 10.

Magnusson, M., et al., "Gold nanogarticles: Production, reshaping, and thermal charging", *Journal of Nanoparticle Research*, Jan. 1, 1999, pp. 243-251, vol. 1.

Samuelson, L., "Self-Forming Nanoscale Devices", *Materials Today*, Oct. 22, 2003, pp. 22-31.

Ohlsson, B., et al., "Fabrication and characterization of III-V nanowhiskers",*MSS10 Conference—Austria*, Jul. 23-27, 2001.

Bjork, M.T., et al., "One-dimensional Steeplechase for Electrons Realized", *Nano Letters*, Jan. 19, 2002, pp. 87-89, vol. 2, No. 2.

Martensson, T., et al., "Fabrication of Individually Seeded Nanowire Arrays by Vapour-Liquid-Solid Growth", *Nanotechnology*, Oct. 17, 2003, pp. 1255-1258, No. 14.

Burgess, D.S., "Nanowire Heterostructures Form Tunneling Diodes", *Photonics Spectra*, pp. 3-5, vol. 37, No. 2.

Pettersson, H., et al., "Electrical and Optical Properties of Self-Assembled InAs Quantum Dots in InP Studied by Space-Charge Spectroscopy and Photoluminescence", *Phys. Rev. B*, Feb. 15, 2000, pp. 4795-4800, vol. 61, No. 7.

Ohlsson, B.J., et al., "Growth and characterization of GaAs and InAs nano-whiskers and InAs/GaAs heterostructures", *Physica E*, Mar. 1, 2002, pp. 1126-1130, No. 13.

Samuelson, L., et al., "Tunnel-Induced Photon Emission in Semiconductors Using an STM", *Physica Scripta*, Jan. 1, 1992, pp. 149-152, vol. T42.

Seifert, W. et al, "In-Situ Growth of Quantum Dot Structures by the Stranski-Krastanow Growth Mode", *Prog. Crys. Growth Charact.*, Jan. 1, 1996, pp. 423-471, vol. 33.

Persson, M., "Tight-Binding Simulation of Nanocrystalline Particles and Whiskers", *Tekn lic thesis, Lund University*, Aug. 1, 2002.

Bjork, M., "Semiconductor Nanowires and Devices", *Tekn lic thesis, Lund University*, Nov. 1, 2002.

Murphy, C.J., et al., "Controlling the Aspect Ratio of Inorganic Nanorods and Nanawires", *Advanced Materials*, Jan. 4, 2002, pp. 80-82, vol. 14, No. 1.

Wagner, R.S., et al., "Vapour-Liquid-Solid Mechanism of Single Crystal Growth", *Applied Physics Letters*, Mar. 1, 1964, pp. 89-90, vol. 4, No. 5.

Canham, L.T., "Silicon Quantum Wire Array Fabrication by Electrochemical and Chemical Dissolution of Wafers", *Applied Physics Letters*, Sep. 3, 1990, pp. 1046-1048, vol. 57.

Koga, T., et al., "Carrier Pocket Engineering Applied to Strained . . . ", *Applied Physics Letters*, Oct. 18, 1999, pp. 2438-2440, vol. 75.

Koga, T., et al., "Experimental Proof-of-Principle Investigation of Enhanced $Z_{3d}$ T in (001) Oriented Si/Ge Superlattices", *Applied Physics Letters*, Sep. 4, 2000, pp. 1490-1492, vol. 77, No. 10.

Narihiro, M., et al., "Resonant tunneling of electrons via 20 nm scale InAs quantum dot and magnetotunneling spectroscopy of its electronic states", *Applied Physics Letters*, Jan. 6, 1997, pp. 105-107, vol. 70, No. 1.

Pan, Z., et al., "Conduction band offset and electron effective mass in GaInNAs/GaAs quantum-well structures with low nitrogen concentration", *Applied Physics Letters*, Apr. 9, 2001, pp. 2217-2219, vol. 78, No. 15.

Ferry, D.K., et al., "Transport in Nanostructures", *Cambridge University Press*, Hardcover, Jan. 1, 1997, pp. 41-45 and 91-96.

Givargizov, E., "Growth of Whiskers by the Vapor-Liquid-Solid Mechanism", *Current Tonics in Material Science*, edited by E. Kaldis, Jan. 1, 1978, pp. 79-145, Chapter 3, vol. 1.

Mullins, J., "News analysis: using unusable frequencies", *IEEE Spectrum*, Jul. 1, 2002, pp. 22-23, vol. 39, No. 7.

Randall, J.N., et al., "Quantum Dot Devices", in Norman G. Einsgruch and William R. Frensley, eds., Heterostructures and Quantum Devices (San Diego, CA: Academic Pres, Inc., 1994) Copyright 1994, p. 420.

Markowitz, P.D., et al., "Phase Separation in $Al_xGa_{1-x}As$ Nanowhiskers Grown by the Solution-Liquid-Solid Mechanism", *J. Am. Chem. Soc.*, Apr. 18, 2001, pp. 4502-4511, vol. 123.

Hickmott, T.W., et al., "Negative Charge, Barrier Heights, and the Conduction-Ban Discontinuity in $Al_xGa_{1-x}As$ Capacitors", *Journal of Applied Physics*, Apr. 15, 1985, pp. 2844-2853, vol. 57.

Matthews, J., et al., "Defects in Epitaxial Multilayers", *Journal of Crystal Growth*, Jan. 1, 1974, pp. 118-125, vol. 27.

Kovtyukhova, N., et al., "Layer-by-Layer Assembly Rectifying Junctions in and on Metal Nanowires", *Journal of Physical Chemistry B*, Aug. 14, 2001, pp. 8762-8769, vol. 105.

Sakaki, H., "Scattering Suppression and High-Mobility Effect of Size-Quantized Electrons in Ultrafine Semiconductor Wire Structures", *Japanese Journal of Applied Physics*, Dec. 1, 1980, pp. L735-L738. vol. 19, No. 12.

Scheibel, H., et al., "Generation of Monodisperse Ag- and NaCl Aerosols With Particle Diameters Between 2 and 300 nm", *Journal of Aerosol Science*, Jan. 1, 1983, pp. 113-126, vol. 14, No. 2.

Knutson, E., et al., "Aerosol Classification by Electric Mobility: Apparatus, Theory, and Applications", *Journal of Aerosol Science*, Jan. 1, 1975, pp. 443-451, vol. 6.

Miller, M., et al., "Serpentine Superlattice: Concept and First Results", *Journal of Crystal Growth*, Jan. 1, 1991, pp. 323-327, vol. 111.

Bhat, R., et al., "Patterned Quantum Well Heterostructures Grown by OMCVD on Non-Planar Substrates: Applications to Extremely Narrow SQW Lasers", *Journal of Crystal Growth*, Jan. 1, 1988, pp. 850-856, vol. 93.

Hara, S., et al, "Formation and Photoldnescence Characterization of Quantum Well Wires Using Multiatdc Steps Grown by Metalorganic Vapor Phase Epitaxy", *Journal of Crystal Growth*, Jan. 1, 1994, pp. 692-697, vol. 145.

Givargizov, E.I., "Fundamental Aspects of VLS Growth", *Journal of Crystal Growth*, Jan. 1, 1975, pp. 20-30, vol. 31.

Derycke, V., et al., "Carbon Nonotube Inter- and Intramolecular Logic Gates", *Nano Letters*, Aug. 26, 2001, pp. 453-456, vol. 1, No. 9.

Iijima, S., "Helical microtubules of graphitic carbon", *Nature*, Nov. 7, 1991, pp. 56-58, vol. 354.

Yao, Z., et al., "Carbon Nanotube Intramolecular Junctions", *Nature*, Nov. 18, 1999, pp. 273-276, vol. 402.

Bennett, C., et al., "Quantum information and computation", *Nature*, Mar. 16, 2000, pp. 247-255, vol. 404.

Michler, P. et al., "Quantum correlation among photons from a single quantum dot at room temperature", *Nature*, Aug. 31, 2000, pp. 968-970, vol. 406, No. 6799.

Chow, E., et al., "Three-dimensional control of light in a two-dimensional photonic crystal slab", *Nature*, Oct. 26, 2000, pp. 983-986, vol. 407.

Venkatasubramanian, R., et al., "Thin-Film Thermoelectric Devices with High Room-Temperature Figures of Merit", *Nature*, Oct. 11, 2003, pp. 597-602, vol. 413.

Bachtold, A., et al., "Scanned probe microscopy of electronic transport in carbon nanotubes", *Phys. Rev. Lett.*, Jun. 26, 2000, pp. 6082-6085, vol. 84, No. 26.

Hicks, L.D., et al., "Thermoelectric Figure of Merit of a One-Dimensional Conductor", *Physical Review B*, Jun. 15, 1993, pp. 16631-16634, vol. 47, No. 24.

Itskevich, I.E., et al., "Resonant magnetotunneling through individual self-assembled InAs quantum dots", *Physical Review B*, Dec. 15, 1996, pp. 16401-16404, vol. 54, No. 23.

Reed, M.A., et al., "Observation of Discrete Electronic States in a Zero-Dimensional Semiconductor Nanostructure", *Physical Review Letters*, Feb. 8, 1988, pp. 535-537, vol. 60, No. 6.

Kapon, E., et al., "Stimulated Emission in Semiconductor Quantum Wire Heterostructures", *Physical Review Letters*, Jul. 24, 1989, pp. 430-433, vol. 63, No. 4.

Santori, C., et al., "Triggered Single Photons from a Quantum Dot", *Physical Review Letters*, Feb. 19, 2001, pp. 1502-1505, vol. 86, No. 8.

Capasso, F., et al., "Quantum Cascade Lasers", *Physics Today*, May 1, 2002, pp. 34-40.

Likharev, K.K., "Single-Electron Devices and their Applications", *Proceedings of the IEEE*, Apr. 1, 1999, pp. 606-632, vol. 87, No. 4.

Han, W., et al., "Synthesis of Gallium Nitride Nanorods Throuah a Carbon Nanotube-Confined Reaction", *Science*, Aug. 29, 1997, pp. 1287-1289, vol. 277.

Zhang, Y., et al., "Heterostructures of Single-Walled Carbon Nanotubes and Carbide Nanorods", *Science*, Sep. 10, 1999, pp. 1719-1722, vol. 285.

Holmes, J., et al., "Control of Thickness and Orientation of Solution-Grown Silicon Nanowires", *Science*, Feb. 25, 2000, pp. 1471-1473, vol. 287.

Zhou, C.W., et al., "Modulated chemical doping of individual carbon nanotubes", *Science*, Nov. 24, 2000, pp. 1552-1555, vol. 290.

Favier, F., et al., "Hydrogen Sensors and Switches from Electrodeposited Palladium Mesowire Arrays", *Science*, Sep. 21, 2001, pp. 2227-2231, vol. 293.

Bachtold, A., et al., "Logic circuits with carbon nanotube transistors", *Science*, Nov. 9, 2001, pp. 1317-1320, vol. 294.

Nicewarner-Pena, S.R., et al., "Submicrometer metallic barcodes", *Science*, Oct. 5, 2001, pp. 137-141, vol. 294.

Service, R.F., "Nanowire Fabricators Earn Their Stripes", *Science*, Jan. 1, 2002, pp. 946-947, vol. 295, No. 5557.

Awschalom, D.D. et al., "Spintronics", *Scientific American*, Jun. 1, 2002, pp. 66-73, vol. 286, No. 6.

Henning, P., et al., "Compositional information from amorphous Si-Ge multilayers using high-resolution electron microscopy imaging and direct digital recording", Ultramicroscopy, Jan. 1, 1996, pp. 221-235, vol. 66.

Wagner, R.S., "VLS Mechanism of Crystal Growth", *Whisker Technology*, A.P. Levitt, ed., Chapter 3, Jan. 1, 1970, pp. 47-119.

Alferov, Z., et al., "For developing semiconductor heterostructures used in high-speed-and opto-electronics", Nov. 23, 2000, www.nobel.se.physics/laureates/2000/.

Von Klitzing, K., "for the discovery of the quantized Hall effect", Jun. 16, 2000, www.nobel.se/physics/laureates/1985/.

Laughlin, R.B., et al., "For their discovery of a new form of quantum fluid with frictionally charged excitations", Jun. 16, 2000, www.nobel.se/physics/laureates/1998/.

Oda, Y., et al., "Natural Formation of Square Scale Structures on Patterned Vicinal Substrates by MOVPE: Application to the Fabrication of Quantum Structures", *Phys. Conf. Ser.*, No. 166, Chapter 4, Aug. 22-26, 1999, pp. 191-194.

Hayakawa, K., et al., "AlGaAs Nano-Meter Scale Network Structures Fabricated by Selective Area MOVPE", *Phys. Conf. Ser.*, No. 162, Chapter 8, Oct. 12-16, 1998.

Akabori, M., et al., "Selective Area MOVPE Growth of Two-Dimensional Photonic Crystals Having an Air-Hole Array and its Application to Air-Bridge-Type structure", *Physica E*, No. 13, Jan. 1, 2002, pp. 446-450.

Melechko, A.V., et al., "Large-Scale Synthesis of Arrays of High-Aspect-Ratio Rigid Vertically Aligned Carbon Nanofibres", *Nanotechnology*, No. 14, Aug. 19, 2003, pp. 1029-1035.

Kempa, K., et al., "Photonic Crystals Based on Periodic Arrays of Aligned Carbon Nanotubes", *Nano Letters*, Nov. 19, 2002, pp. 13-18, vol. 3, No. 1.

Takahashi, H., et al., "Formation and Characteristics of 100 nm Scale GaAs Quantum Wires by Selective Area MOVPE", *Applied Surface Science*, No. 216, Jan. 1, 2003, pp. 402-406.

Akabori, M., et al., "InGaAs Nano-Pillar Array Formation on Partially Masked InP(111)B by Selective Area Metal-Organic Vapour Phase Egitaxial Growth for Two-Dimensional Photonic Crystal Application", *Nanotechnology*, No. 14, Aug. 27, 2003, pp. 1071-1074.

Kamins, T.I., et al., "Self-Assembled Silicon Nanowires for Integrating Microsystems, Nanoelectronics and Microelectronics", *mstnews*, 3/03, Mar. 1, 2003.

Wu, Y., et al., "Rational Synthesis of Inorganic Nanowires", *Abstracts of Papers in the Amer. Chem. Soc.*, Apr. 1, 2001, pp. 108-Iec Part 1, vol. 221.

Yang, P., et al., "Nanowires from Vapor Condensation and their Assemblies", *Abstracts of Papers in the Amer. Chem. Soc.*, Mar. 26, 2000, pp. 269-Inor Part 1, vol. 219.

Huang, M., et al., "Nanowire Array as Potential 2-d Photonic Bandgap Materials", *Abstracts of Paners in the Amer. Chem. Soc.*, Apr. 1, 2001, pp. 95-Phys Part 2, vol. 221.

Yang, P., et al., "Inorganic Nanowires: Rational Synthesis, Functional Assemblies and Novel Properties", *Abstracts of Papers in the Amer. Chem. Soc.*, Apr. 7, 2002, pp. 343-Inor Part 2, vol. 223.

Gates, B., et al., "Synthesis and Characterization of Crystalline Ag2Se Nanowires through a Template-Engaged Reaction at Room Temperature", *Advanced Fun. Materials*, Oct. 1, 2002, pp. 679-686, vol. 12, No. 10.

Yang, P., et al., "Controlled Growth of ZnO Nanowires and their Optical Properties", *Advanced Functional Materials*, May 2002, pp. 323-331, vol. 12, No. 5.

Wu, Y., et al., "Superconducting MgB2 Nanowires", *Advanced Materials*, Oct. 2, 2001, pp. 1487-1489, vol. 13, No. 19.

Huang, M., et al., "Catalytic Growth of Zinc Oxide Nanowires by Vapor Transport", Advanced Materials, Jan. 16, 2001, pp. 113-116, vol. 13, No. 2.

Wu, Y., et al., "Melting and Welding Semiconductor Nanowires in Nanotubes", *Advanced Materials*, Apr. 4, 2001, pp. 520-523, vol. 13, No. 7.

Zheng, B., et al., "Synthesis of Ultra-Long and Highly Oriented Silicon Oxide Nanowires from Liquid Alloys", *Advanced Materials*, Jan. 16, 2002, pp. 122-124, vol. 14, No. 2.

Kind, H., et al., "Nanowire Ultraviolet Photodetectors and Optical Switches", *Advanced Materials*, Jan. 16, 2002, pp. 158-160, vol. 14, No. 2.

Xia, Y., et al., "Chemistry and Physics of Nanowires", *Advanced Materials*, Mar. 4, 2003, pp. 351-352, vol. 15, No. 5.

Xia, Y., et al., "One-Dimensional Nanostructures: Synthesis, Characterization, and Applications", *Advanced Materials*, Mar. 4, 2003, pp. 353-389, vol. 15, No. 5.

Yan, H., et al., Morphogenis of One-Dimensional ZnO Nano- and Microcrystalsm, *Advanced Materials*, Mar. 4, 2003, pp. 402-405, vol. 15, No. 5.

Wu, Y., et al., "Germanium/Carbon Core-Sheath Nanostructures", *Applied Physics Letters*, Jul. 3, 2000, pp. 43-45, vol. 77, No. 1.

Wu, Y., et al., "Inorganic Semiconductor Nanowires: Rational Growth, Assembly, and Novel Properties", *Chemistry-A European Journal*, Mar. 15, 2002, pp. 1261-1268, vol. 8, No. 6.

Yang, P., et al., "Langmuir-Blodgett Assembly of One-Dimensional Nanostructures", *Chemphyschem*, Jun. 17, 2002, pp. 503-506, vol. 3, No. 6.

Wu, Y., et al., "Direct Observation of Vapor-Liquid-Solid Nanowire Growth", *J. Am. Chem. Soc.*, Mar. 13, 2001, pp. 3165-3166, vol. 123.

Yan, H., et al., "Dendritic Nanowire Ultraviolet Laser Array", *J. Am. Chem. Soc.*, Mar. 29, 2003, pp. 4728-4729, vol. 125, No. 16.

Johnson, J., et al., "Single Nanowire Lasers", *Journal of Physical Chemistry B*, Oct. 23, 2001, pp. 11387-11390, vol. 105, No. 46.

Messer, B., et al., "Microchannel Networks for Nanowire Patterning", *Journal of the Amer. Chem. Soc.*, Sep. 29, 2000, pp. 10232-10233, vol. 122, No. 41.

Song, J., et al., "MMo$_3$Se$_3$ (M=Li+,Na+, Rb+,Cs+, NMe4+) Nanowire Formation via Cation Exchange in Organic Solution", *Journal of the Amer. Chem. Soc.*, Mar. 10, 2001, pp. 9714-9715, vol. 123, No. 39.

Li, Y., et al, "Bismuth Nanotubes: A Rational Low-Temperature Synthetic Route", Journal of the Amer. Chem. Soc., Sep. 14, 2001, pp. 9904-9905, vol. 123, No. 40.

Song, J., et al., "Metal Nanowire Formation Using Mo$_3$Se$_3$-as Reducing and Sacrificing Templates", Journal of the Amer. Chem. Soc., Sep. 26, 2001, pp. 10397-10398, vol. 123, No. 42.

Gates, B., et al., "Single-Crystalline Nanowires of Ag2Se Can Be Synthesized by Templating Against Nanowires of Trigonal Se", *Journal of the Amer. Chem. Soc.*, Oct. 25, 2001, pp. 11500-11501, vol. 123, No. 46.

Wu, Y., et al., "Block-by-Block Growth of Single-Crystalline Si/SiGe Superlattice Nanowires", *Nano Letters*, Jan. 19, 2002, pp. 83-86, vol. 2, No. 2.

Johnson, J., et al., "Near-Field Imaging of Nonlinear Optical Mixing in Single Zinc Oxide Nanowires", *Nano Letters*, Apr. 1, 2002, pp. 279-283, vol. 2, No. 4.

Johnson, J., et al., "Single Gallium Nitride Nanowire Lasers", *Nature Materials*, Sep. 15, 2002, pp. 106-110, vol. 1, No. 2.

Huang, M.H., et al., "Room-Temperature Ultraviolet Nanowire Nanolasers", *Science*, Jun. 8, 2001, pp. 1897-1899.

Wu, Y., et al., "Germanium Nanowire Growth via Sample Vapor Transport", *Chem. Mater*, Mar. 20, 2000, pp. 605-607, vol. 12.

Wu, Y., et al., "Semiconductor Nanowire Array: Potential Substrates for Photocatalysis and Photovoltaics", *Topics in Catalysis*, Apr. 1, 2002, pp. 197-202, vol. 19, No. 2.

Hiruma, K., et al., "GaAs free-standing quantum-size wires", *Journal of Applied Physics*, Sep. 1, 1993, pp. 3162-3171, vol. 74.

Liu J.L., et al., "Gas-source MBE growth of freestanding Si nanowires on Au/S1 substrate", *Superlattices Microstructures*, 1999, pp. 477-479, vol. 25, No. 1-2.

Shimada, et al., "Size, position and direction control on GaAs and InAs nanowhisker growth", *Superlattices and Microstructures*, Dec. 1998, pp. 453-458, vol. 24, No. 6.

Shirai, M., et al., "Gold cluster formation using an atomic force microscope and its applications to GaAs whisker growth", *Superlattices and Microstructures*, Aug. 1998, pp. 157-162, vol. 24, No. 2.

Hiruma, K., et al., "Gas and InAs Nanowire Growth Technology", *Proceedings of the Science and Technology of Atomically Engineered Materials*, Oct. 30, 1995, pp. 563-570.

Westwater, J., et al., "Control of the size and position of silicon nanowires grown via the vapor-liquid-solid technique", *Japanese Journal of Applied Physics*, Part 1, Oct. 1997, pp. 6204-6209, vol. 36.

O'Regan, et al., "A Low-Cost, High-Efficiency Solar Cell Based on Dye-Sensitized Colloidal TiOa Films", *Nature*, Oct. 24, 1991, pp. 737-740, vol. 353.

Jun, et al., "Architectural Control of Magnetic Semiconductor Nanocrystals", *J. Am. Checm Soc.*, Jan. 4, 2002, pp. 615-619, vol. 124, No. 4.

Manna, et al., "Synthesis of Soluble and Processable Rod-, Arrow-, Teardrop-, and Tetrapod-Shaped CdSe Nanocrystals", *J. Am. Chec. Soc.*, Dec. 1, 2000, pp. 12700-12706, vol. 122, No. 51.

Huang, et al., "Directed Assembly of one-dimensional nanostructures into functional networks", *Science*, Jan. 26, 2001, pp. 630-633, vol. 291.

Persson, "Heterointerfaces in III-V semiconductor nanowhiskers", *IEEE*, 2002, pp. 281-283.

GAO, et al., "Self-Assembled Nanowire-Nanoribbon Junction Arrays of ZnO", *The Journal of Physical Chemistry*, Nov. 12, 2002, pp. 12653-12658, vol. 106, No. 49.

Jun, et al., "Controlled Synthesis of Multi-Armed CdS Nanorod Architectures Using Monosurfactant System", *J. Am. Chem. Soc.*, May 5, 2001, pp. 5150-5151, vol. 123.

Poole, et al., "Spatially Controlled, Nanoparticle-Free Growth of InP Nanowires", *Applied Physics Letters*, Sep. 8, 2002, pp. 2055-2057, vol. 83, No. 10.

Hiruma et al., "Quantum Size Microcrystals Grown Using Organametallic Vapor Phase Epitaxy", *Appl. Phys. Lett.*, vol. 59, No. 4, Jul. 22, 1991, pp. 431-433.

Ozaki et al., "Silicon Nanowhiskers Grown on a Hydrogen-Terminated Silicon (111) Surface", *Applied Physics Letters*, vol. 73, No. 25, Dec. 21, 1998, pp. 3700-3702.

Wu et al., "Growth, Branching, and Kinking of Molecular-Beam Epitaxial <110> GaAs Nanowires", *Applied Physics Letters*, vol. 83, No. 16, Oct. 20, 2003, pp. 3368-3370.

Grätzel, "Photoelectrochemical Cells", *Nature*, vol. 414, Nov. 15, 2001, pp. 338-344.

Wang et al., "Nanocrystals Branch Out", *Nature Materials*, vol. 2, Jun. 2003, pp. 385-386.

Manna et al., "Controlled Growth of Tetrapod-Branched Inorganic Nanocrystals", *Nature Materials*, vol. 2, Jun. 2003, pp. 382-385.

Wang et al., "Rational Growth of Branched and Hyperbranched Nanowire Structures", *Nano Letters*, vol. 4, No. 5, Mar. 31, 2004.

Dick et al., "Synthesis of Branched 'Nanotrees' by Controlling Seeding of Multiple Branching Events", *Nature Materials*, vol. 3, May 2, 2004.

Oda et al., "Natural Formation of Square Scale Structures on Patterned Vicinal Substrates by MOVPE: Application to the Fabrication of Quantum Structures", *Inst. Phys. Conf. Ser.*, No. 166, Chapter 4, Aug. 22, 1999, pp. 191-194.

Akabori et al., "Selective Area MOVPE Growth of Two-Dimensional Photonic Crystals Having an Air-Hole Array and its Application to Air-Bridge-Type Structures", *Physica E*, No. 13, 2002, pp. 446-450.

Melechko et al., "Large-Scale Synthesis of Arrays of High-Aspect-Ratio Ridig Vertically Aligned Carbon Nanofibres", *Nanotechnology*, No. 14, Aug. 19, 2003, pp. 1029-1035.

Wu et al., "Single-Crystal Metallic Nanowires and Metal/Semiconductor Nanowire Heterostructures", *Nature*, vol. 430, Jul. 1, 2004, pp. 61-65.

Zhong et al., "Nanowire Crossbar Arrays as Address Decoders for Integrated Nanosystems" *Science*, vol. 302, Nov. 21, 2003, pp. 1377-1379.

McAlpine et al., "High-Performance Nanowire Electronics and Photonics on Glass and Plastic Substrates", *Nano Letters*, vol. 3, No. 11, Oct. 14, 2003, pp. 1531-1535.

Greytak et al., "Growth and Transport Properties of Complementary Germanium Nanowire Field-Effect Transistors", *Applied Physics Letters*, vol. 84, No. 21, May 24, 2004, pp. 4176-4178.

Whang et al., "Large-Scale Hierarchical Organization of Nanowire Arrays for Integrated Nanosystems", *Nano Letters*, vol. 3, No. 9, Aug. 5, 2003, pp. 1255-1259.

McAlpine et al., "Nanoimprint Lithography for Hybrid Plastic Electronics", *Nano Letters*, vol. 3, No. 4, Mar. 7, 2003, pp. 443-445.

Bozovic et al., "Plastic Deformation in Mechanically Strained Single-Walled Carbon Nanotubes", *Physical Reivew B*, vol. 57, Jan. 22, 2003, pp. 033407-1-033407-4.

Hahm et al., "Direct Ultrasensitive Electrical Detection of DNA and DNA Sequence Variations Using Nanowire Nanosensors", *Nano Letters*, vol. 4, No. 1, Dec. 9, 2003, pp. 51-54.

Lieber, "Nanoscale Science and Technology: Building a Big Future from Small Things", MRS Bulletin, Jul. 2003, pp. 486-491.

Yu et al., "Silicon Nanowires: Preparation, Device Fabrication, and Transport Properties", *J. Phys. Chem. B.*, vol. 104, No. 50, Nov. 23, 2000, pp. 11864-11870.

Law et al., "Photochemical Sensing of $NO_2$ with $SnO_2$ Nanoribbon Nanosensors at Room Temperature", *Angew. Chem. Int. Ed.*, vol. 41, No. 13, 2002, pp. 2405-2408.

Lao et al., "Hierarchical ZnO Nanostructures", *Nano Letters*, vol. 2, Sep. 13, 2002, pp. 1287-1291.

Barrelet et al., "Synthesis of CdS and ZnS Nanowires Using Single-Source Molecular Precursors", *J. Am. Chem. Soc.*, vol. 125, 2003, pp. 11498-11499.

Björk et al., "Few-Electron Quantum Dots in Nanowires", *Nano Letters*, vol. 4, No. 9, Jul. 28, 2004, pp. 1621-1625.

Martensson et al., "Nanowire Arrays Defined by Nanoimprint Lithography", *Nano Letters*, vol. 4, Mar. 17, 2004, pp. 699-702.

Hornstra, "Dislocations in the Diamond Lattice", *J. Phys. Checm. Solids*, vol. 5, 1958, pp. 129-141.

Krost et al., "InP on Si(111): Accommodation of Lattice Mismatch and Structural Properties", *Appl. Phys. Lett.*, vol. 64, No. 7, Feb. 7, 1994, pp. 769-771.

Gorbach et al., "Growth of III-V Semiconductor Layers on Si Patterned Substrates", *Thin Solid Films*, vol. 336, 1998, pp. 63-68.

Ohlsson et al., "Anti-Domain-Free GaP, Grown in Atomically Flat (001) Si Sub-μm-sized Openings", *Applied Physics Letters*, vol. 80, No. 24, Jun. 17, 2002, pp. 4546-4548.

Kawanami, "Heteroepitaxial Technologies of III-V on Si", *Solar Energy Materials & Solar Cells*, vol. 66, 2001, pp. 479-486.

Westwater et al., "Growth of Silicon Nanowires Via Gold/Silane Vapor-Liquid-Solid Reaction", *J. Vac. Sci. Technol. B.*, vol. 15, No. 3, 1997, pp. 554-557.

Kamins et al., "Ti-Catalyzed Si Nanowjres by Chemical Vapor Deposition: Microscopy and Growth Mechanisms", *Journal of Applied Physics*, vol. 89, No. 2, Jan. 15, 2001, pp. 1008-1018.

Schubert et al., "Silicon Nanowhiskers Grown on <111> Si Substrates by Molecular-Bean Epitaxy", *Applied Physics Letters*, vol. 84, No. 24, Jun. 14, 2004, pp. 4968-4970.

Kamins et al., "Growth and Structure of Chemically Vapor Deposited Ge Nanowires on Si Substrates", *Nano Letters*, vol. 4, No. 3, Jan. 23, 2004, pp. 503-506.

Thornton et al., "A Photoemission Study of Passivated Silicon Surfaces Produced by Etching in Solutions of HF", *Semicond. Sci. Technol.*, vol. 4, 1989, pp. 847-851.

Borgstrom et al., "Size- and Shape-Controlled GaAs Nano-Whiskers Grown by MOVPE: A Growth Study", *Journal of Crystal Growth*, vol. 260, 2004, pp. 18-22.

Westwater et al., "Si Nanowires Grown Via the Vapour-Liquid-Solid Reaction", *Phys. Stat. Sol.*, vol. (a)165, 1998, pp. 37-42.

Westwater et al., "The Characteristics and Oxidation of Vapor-Liquid-Solid Grown Si Nanowires", *Mat. Res. Soc. Symp. Proc.*, vol. 452, 1997, pp. 237-242.

Westwater et al., "Nanoscale Silicon Whiskers Formed by Silane/Gold Reaction at 335° C", *Materials Letters*, vol. 24, Jun. 1995, pp. 109-112.

Yang, "Semiconductor Nanowire Array", *Proceedings of the SPIE*, vol. 4806, 2002, pp. 222-224.

Kuykendall et al., "Crystallographic Alignment of High-Density Gallium Nitride Nanowire Arrays", *Nature Materials*, vol. 3, Jul. 25, 2004, pp. 524-528.

Abramson et al., "Fabrication and Characterization of a Nanowire/Polymer-Based Nanocomposite for a Prototype Thermoelectric Device", *Journal of Microelectromechanical Systems*, vol. 13, No. 3, Jun. 2004, pp. 505-513.

Abramson et al., "Nanowire Composite Thermoelectric Devices", *Proceedings of IMECE 2002, ASME International Mechanical Engineering Congress & Exposition*, Nov. 17-22, 2002, pp. 7-11.

Johnson et al., "Single Nanowire Waveguides and Lasers", *Proceedings of SPIE*, vol. 5223, 2003, pp. 187-196.

Greene et al., "Low-Temperature Wafer-Scale Production of ZnO Nanowire Arrays", *Angew. Chem. Int. Ed.*, vol. 42, 2003, pp. 3031-3034.

Kim et al., "Nanowire Arrays for Thermoelectric Devices", *Proceedings of HT2003, ASME Summer Heat Transfer Conference*, Jul. 21-23, 2003, pp. 101-104.

Choi et al., "Self-Organized GaN Quantum Wire UV Lasers", *J. Phys. Chem. B.*, vol. 107, 2003, pp. 8721-8725.

Yang, "From Nanowire Lasers to Quantum Wire Lasers", *Proceedings of SPIE*, vol. 5349, 2004, pp. 18-23.

Mikkelsen et al., "Direct Imaging of the Atomic Structure Inside a Nanowire by Scanning Tunneling Microscopy", *Nature Materials*, vol. 3, Jul. 4, 2004, pp. 519-523.

Thelander et al., "Electron Transport in InAs Nanowires and Heterostructure Nanowire Devices", *Solid State Communications*, vol. 131, Jun. 11, 2004, pp. 573-579.

Samuelson et al., "Semiconductor Nanowires for Novel One-Dimensional Devices", *Physica E*, vol. 21, 2004, pp. 560-567.

Shorubalko et al., "Tunable Nonlinear Current-Voltage Characteristics of Three-Terminal Ballistic Nanojunctions", *Applied Physics Letters*, vol. 83, No. 12, Sep. 22, 2003, pp. 2369-2371.

Samuelson et al., "Fabrication and Spectroscopic Studies of InP/GaInAs/Inp and GaAs/GaInAs/GaAs Quantum-Well Wire Structures", *Inst. Phys. Confer. Ser.* No. 127, Chapter 3, Jan. 1, 1992, pp. 95-98.

Samuelson et al., "Fabrication and Imaging of Quantum Well Wire Structures", *SPIE*, vol. 1676, 1992, pp. 154-160.

Larsson et al., "Probing of Individual Semiconductor Nanowhiskers by TEM-STM", *Microscopy and Microanalysis*, vol. 10, 2004, pp. 41-46.

Ramvall et al., Quantized Conductance in a Heterostructurally Defined $Ga_{0.25}In_{0.75}As/InP$, *Appl. Phys. Lett.*, vol. 71, Aug. 18, 1997, pp. 918-920.

Ng et al., "Growth of Epitaxial Nanowires at the Junctions of Nanowalls", *Science*, vol. 300, May 23, 2003, p. 12.

Ng et al., "Epitaxial Single Crystalline Inorganic Nanowires and Nanowalls: Growth Morphogenesis and Applications in Nano-Optoelectronics", *Proceedings of SPIE*, vol. 5349, 2004, pp. 11-17.

Ng et al., "Three Dimensional Columnar Optical Nanostructures Fabricated by Using Lithography-Free Templating Approach", *Applied Physics Letters*, vol. 84, No. 15, Apr. 12, 2004, pp. 2898-2900.

Thelander et al., "One Dimensional Heterostructures and Resonant Tunneling in III-V Nanowires", *IEEE International Symposium on Compound Semiconductors*, Aug. 25, 2003, pp. 151-152.

Björk et al., "Heterostructures in One-Dimensional Nanowires", *Proceedings of 7th International Conference of Nanometer-Scale Science and Technology and 21st European Conference on Surface Science*, Jun. 24, 2002.

Ohlsson et al., "Comparison Between (111)B and (100)III-V Nanowhiskers", Proceedings of 7th International Conference of Nanometer-Scale Science and Technology and 21st European Conference on Surface Science, Jun. 24, 2002.

Larsson et al, In-Situ Manipulations and Electrical Measurements of III-V Nanowhiskers with TEM-STM, Proceedings of 7th International Conference of Nanometer-Scale Science and Technology and 21st European Conference on Surface Science, Jun. 24, 2002.

Persson et al., "Solid-phase-diffusion mechanism for GaAs nanowire growth", *Nature Materials*, vol. 3, Oct. 2004, pp. 677-681.

Ng et al., "Single Crystal Nanowire Vertical Surround-Gate-Field-Effect Transistor", *Nano Letters*, vol. 4, No. 7, May 29, 2004, pp. 1247-1252.

Lieber et al., "Nanowires as Building Blocks for Nanoelectronics and Nanophotonics", *Electron Devices Meeting 2003 IEEE International*, 2003, pp. 12.3.1-12.3.3.

Martensson et al., "Epitaxial-III-V Nanowires on Silicon", *Nano Letters*, vol. 4, No. 10, Sep. 23, 2004, pp. 1987-1990.

Jensen et al., "Role of Surface Diffusion in Chemical Beam Epitaxy of InAs Nanowires", *Nano Letters*, vol. 4, No. 10, Sep. 14, 2004, pp. 1961-1964.

\* cited by examiner

DIRECTIONALLY CONTROLLED GROWTH OF NANOWHISKERS

CROSS-REFERENCE TO RELATED APPLICATIONS

This application claims the benefit of the priority of U.S. Provisional Patent Application No. 60/541,949 filed Feb. 6, 2004, the entirety of which is incorporated herein by reference.

BACKGROUND OF THE INVENTION

1. Field of the Invention

This invention relates generally to structures produced by techniques of nanotechnology, and methods of producing such structures. More specifically, the invention relates to such structures and devices incorporating at least one element, essentially in one-dimensional form, which is of nanometer dimensions in its width or diameter, which is produced with the aid of a catalytic particle, and which is commonly termed a "nanowhisker."

2. Background Art

Nanotechnology covers various fields, including that of nanoengineering, which may be regarded as the practice of engineering on the nanoscale. This may result in structures ranging in size from small devices of atomic dimensions, to much larger scale structures—for example, on the microscopic scale. Typically, nanostructures are devices having at least two dimensions less than about 1 μm (i.e., nanometer dimensions). Ordinarily, layered structures or stock materials having one or more layers with a thickness less than 1 μm are not considered to be nanostructures. Thus, the term nanostructures includes free-standing or isolated structures that have two dimensions less than about 1 μm, that have functions and utilities different from those of larger structures, and that are typically manufactured by methods different from conventional procedures for preparing somewhat larger, i.e., microscale, structures. Although the exact boundaries of the class of nanostructures are not defined by a particular numerical size limit, the term has come to signify such a class that is readily recognized by those skilled in the art. In many cases, an upper limit of the size of the at least two dimensions that characterize nanostructures is about 500 nm. In some technical contexts, the term "nanostructure" is construed to cover structures having at least two dimensions of about 100 nm or less. In a given context, the skilled practitioner will recognize the range of sizes intended. In this application, the term "nanostructure" is broadly intended to refer to an elongated structure having at least two transverse dimensions less than about 1 μm, as indicated above. In more preferred applications, such dimensions will be less than about 100 nm, more preferably less than about 50 nm, and even more preferably less than about 20 nm.

Nanostructures include one-dimensional nanoelements, essentially in one-dimensional form, that are of nanometer dimensions in their width or diameter, and that are commonly known as nanowhiskers, nanorods, nanowires, nanotubes, etc.

The basic process of whisker formation on substrates by the so-called VLS (vapor-liquid-solid) mechanism is well known. A particle of a catalytic material, usually gold, is placed on a substrate and heated in the presence of certain gases to form a melt. A pillar forms under the melt, and the melt rises up on top of the pillar. The result is a whisker of a desired material with the solidified particle melt positioned on top. See Wagner, *Whisker Technology*, Wiley, New York, 1970, and E. I Givargizov, *Current Topics in Materials Science*, Vol. 1, pages 79-145, North Holland Publishing Company, 1978. In early applications of this technique, the dimensions of such whiskers were in the micrometer range, but the technique has since also been applied for the formation of nanowhiskers. For example, International Patent Application Publication No. WO 01/84238 (the entirety of which is incorporated herein by reference) discloses in FIGS. 15 and 16 a method of forming nanowhiskers, wherein nanometer sized particles from an aerosol are deposited on a substrate and these particles are used as seeds to create filaments or nanowhiskers.

Although the growth of nanowhiskers catalyzed by the presence of a catalytic particle at the tip of the growing whisker has conventionally been referred to as the VLS (Vapor-Liquid-Solid process), it has come to be recognized that the catalytic particle may not have to be in the liquid state to function as an effective catalyst for whisker growth. At least some evidence suggests that material for forming the whisker can reach the particle-whisker interface and contribute to the growing whisker even if the catalytic particle is at a temperature below its melting point and presumably in the solid state. Under such conditions, the growth material, e.g., atoms that are added to the tip of the whisker as it grows, may be able to diffuse through a the body of a solid catalytic particle or may even diffuse along the surface of the solid catalytic particle to the growing tip of the whisker at the growing temperature. Persson et al., "Solid-phase diffusion mechanism for GaAs nanowires growth," *Nature Materials*, Vol. 3, October 2004, pp 687-681, shows that, for semiconductor compound nanowhiskers there may occur solid-phase diffusion mechanism of a single component (Ga) of a compound (GaAs) through a catalytic particle. Evidently, the overall effect is the same, i.e., elongation of the whisker catalyzed by the catalytic particle, whatever the exact mechanism may be under particular circumstances of temperature, catalytic particle composition, intended composition of the whisker, or other conditions relevant to whisker growth. For purposes of this application, the term "VLS process," or "VLS mechanism," or equivalent terminology, is intended to include all such catalyzed procedures wherein nanowhisker growth is catalyzed by a particle, liquid or solid, in contact with the growing tip of the nanowhisker.

For the purposes of this specification the term "nanowhisker" is intended to mean a one-dimensional nanoelement with a width or diameter (or, generally, a cross-dimension) of nanometer size, the element preferably having been formed by the so-called VLS mechanism, as defined above. Nanowhiskers are also referred to in the art as "nanowires" or, in context, simply as "whiskers" or "wires."

Freestanding nanowhiskers have drawn increasing attention for their potential use in applications in electronics and photonics.

As already shown in the early work of Wagner, referenced above, the preferential growth direction of such nanowhiskers is <111>. One drawback of <111> oriented nanowhiskers is the high density of stacking faults that commonly form perpendicular to the growth direction. These defects are expected to affect the physical properties of the nanowhiskers. Another drawback with this preferential growth direction is its non-compatibility with the (001) crystal face of the main surface of substrates commonly used in industrial applications. That is, the preferential growth direction is oblique rather than normal to the substrate main surface, the normal direction being <001>. For example, with III-V compounds, the commonly commercially available substrates have an (001) crystal face as the main surface. In contrast, nanowhiskers of III-V compounds preferentially grow in a <111>B direction from a (111)B crystal plane.

Hiruma et al., *J. Appl. Phys.*, 77(2), 15 Jan. 1995, pages 447-462, reported the growth on InAs nanowhiskers on GaAs substrates having various surfaces including, in particular, the (001) surface. The InAs nanowires invariably grew in the <111> direction, resulting, for example, in pairs of wires ([1-11] and [-111]) tilted with an angle of 35° towards the (001) surface.

Other growth directions for nanowhiskers have been observed to occur sporadically during whisker growth. For instance, Wu et al, "Growth, branching, and kinking of molecular beam epitaxial <110> GaAs nanowires," *Applied Physics Letters*, 20 Oct. 2003, Vol. 83, No. 16, pp 3368-3370, disclosed an <011> direction for GaAs nanowhiskers grown on GaAs (001) by molecular beam epitaxy (MBE).

Björk et al, "One-Dimensional Heterostructures In Semiconductor Nanowhiskers," *Applied Physics Letters*, Vol. 80, No. 6, 11 Feb. 2002, pages 1058-1060, described an <001> segment of an InAs/InP heterostructured nanowhisker grown from a (111)B GaAs surface in chemical beam epitaxy (CBE), the segment having deviated from the initial <111>B growth direction of the nanowhisker. More particularly, it had been observed that whereas most nanowhiskers grew in the <111>B direction, there were sporadically formed nanowhiskers in the form of a "hockey-stick" that initially grew in the <111>B direction, but "kinked" to the <001> direction. The nanowhisker disclosed had a base region of InAs and grew in the <001> direction as a result of the compressive strain at the InP/InAs interface. Growth of a nanowhisker in the <001> direction dramatically reduces the formation of defects, such as stacking faults.

In International Patent Application Publication No. WO 2004/004927 (the entirety of which is incorporated herein by reference), there is disclosed in FIG. 24(b) a technique for controlling the growth direction of whiskers wherein, by applying strain to the whisker during formation, by change of growth conditions, the direction of growth of the whisker can be changed to the <100> direction from the usual <111> direction. Alternatively, a short bandgap segment of a wide bandgap material may be grown at the base of the nanowhisker.

Still further improvements in the control of the growth direction of nanowhiskers are desirable. For example, a method that would provide for an initial whisker growth direction normal to an incompatible substrate surface—that is, where the preferential growth direction of the whisker is oblique to the surface—would be highly desirable, as would structures produced by such method. Such a method would allow for the growth of whiskers that are normal to the surface over their entire length (or, more generally, at least the initial portion of their length) as opposed to the kinked nanowhiskers having an initial growth direction oblique to the surface as previously observed.

SUMMARY OF THE INVENTION

The present invention relates to directionally controlled growth of nanowhiskers and to structures including such nanowhiskers, and provides, among other things, methods and structures having the highly desirable characteristics just described. The invention thus provides methods and structures in which a nanowhisker has at least a base portion grown in a non-preferential growth direction from a substrate surface.

DISCLOSURE OF THE INVENTION

The invention, from one perspective, recognizes that nanowhiskers of particular semiconductor materials have preferential directions for growth, and that commonly available substrates of particular semiconductor materials have particular crystal facets defining a major surface that does not correspond to a preferential growth direction. The present invention therefore provides a mechanism for growth of nanowhiskers that will permit growth of nanowhiskers in a non-preferential growth direction from a substrate major surface defined by a crystal facet that does not correspond to a preferential growth direction.

The invention also provides a nano-engineered structure that comprises a nanowhisker upstanding from (or at least having an initial or base portion upstanding from) a substrate major surface in a non-preferential growth direction, wherein a crystal facet defining the surface corresponds to the non-preferential direction of growth of the nanowhisker. The growth direction of the nanowhisker is preferably maintained over its entire length. However, it is within the broader scope of the invention that the growth direction can be changed from the initial, non-preferential growth direction by changing growth conditions (e.g., constituent materials) of the whisker after growth of the whisker base portion.

More generally, the invention provides nanostructures incorporating nanowhiskers grown on substrates, having improved structural form.

For the purposes of this specification, it will be understood that where a surface or crystal facet is defined by Miller indices (hkl), where h, k and l are numerical values, then this "corresponds" to a nanowhisker growth direction <hkl>.

The present invention, from another perspective, recognizes that where it is desired deliberately to grow a nanowhisker from a substrate surface in a non-preferential growth direction, nucleation conditions at the onset of growth can be regulated such that there is not created at an interface between a catalytic particle and the substrate a condition that would cause growth of the nanowhisker in a preferential growth direction.

Thus, in accordance with another of its aspects, the invention provides a method of growing nanowhiskers on a substrate surface providing a predetermined crystal plane, the method comprising providing at least one catalytic particle on the substrate surface, and growing a nanowhisker from each said catalytic particle in a predetermined growth direction that is a non-preferential growth direction for the nanowhisker, with nucleation conditions at the onset of growth being regulated to control the interface between each said catalytic particle and the substrate such that said crystal plane is maintained as said substrate surface at the interface so as to define and stabilize said predetermined growth direction. The nanowhisker can be of the same material or of a different material from that of the substrate.

In accordance with the present invention, the nanowhisker growth direction can be defined and stabilized by controlling the surface conditions at the onset of the nucleation event. This nucleation can be strongly affected by pre-treatment of the catalytic particle at the substrate surface. Conventionally, an annealing step at high temperature is performed subsequent to providing the catalytic particles on the substrate surface and prior to initiation of nanowhisker growth. In such an annealing step, substrate material is consumed by or dissolved into the catalytic particles, and this creates depressions or recesses in the substrate surface in which the catalytic particles sit. Such depressions may expose crystal facets such as (111) that may bring about nanowhisker growth perpendicular to such facets in a preferential direction such as <111>. Thus, in practice of the present invention, such an annealing step is preferably omitted. More generally, the nucleation stage of initial nanowhisker growth preferably comprises absorbing constituent materials from the gaseous phase to create supersaturation conditions within the catalytic particle; substrate material does not contribute to a significant extent.

When nucleation conditions are initiated, it is preferred to maintain temperature as low as possible, consistent with ensuring proper nucleation and growth. Further, it has been found that the catalytic particle, when heated under such conditions, may perform an "ironing" effect on the underlying substrate surface to "iron-out" irregularities, atomic steps, etc., and this further contributes to maintaining a well-defined surface. The surface may amount to an atomically flat surface, with no atomic steps, etc., so that a nanowhisker has no other possibility than to grow in the desired non-preferential direction. However, perfect atomic flatness may not be necessary in order to force growth in the desired direction.

Further, the catalytic particle, while usually of a non-reactive material such as Au, may be formed of, or include, a constituent element (e.g., a group III material such as In) of the nanowhisker. Nucleation and supersaturation conditions may thus be achieved more quickly, with a reduced amount of the constituent material being absorbed into the catalytic particle from its surroundings.

In a further aspect, the invention provides a structure comprising a substrate having a surface providing an (001) crystal plane, and at least one nanowhisker extending, at least initially, from the surface in an <001> direction relative to the surface, wherein the <001> direction corresponds to a non-preferential direction of growth for the nanowhisker, in that one or more other directions are more conducive to growth.

In a more general aspect, the invention provides a structure comprising a substrate having a major surface defined by a predetermined crystal plane, and at least one nanowhisker extending, at least initially, from the surface in a direction corresponding to the crystal plane, wherein the direction of the nanowhisker is a non-preferential direction of growth for the nanowhisker, in that one or more other directions are more conducive to growth.

It has been found that the (001) surface of III-V materials is particularly conducive to bulk epitaxial growth, when exposed to appropriate materials in gaseous form. This may compete with, inhibit or obstruct nanowhisker growth.

In accordance with a further aspect of the invention, a method of growing nanowhiskers on a substrate surface comprises disposing at least one catalytic particle on the substrate surface, the substrate surface providing a predetermined crystal plane, and growing a nanowhisker from each said catalytic particle in a predetermined direction from the surface that does not correspond to a preferential direction of growth for the nanowhisker, and wherein prior to establishment of growth conditions, a mask of passivating material is formed on the substrate surface to inhibit bulk growth of material used to form the nanowhisker.

In one preferred implementation, the invention provides a method of growing nanowhiskers on an (001) surface of a substrate of III-V semiconductor material, wherein at least one catalytic particle is disposed on the (001) substrate surface, and growth conditions are established wherein heat is applied, and constituent materials are introduced in gaseous form, from which to grow a nanowhisker from each said catalytic particle in an <001> direction relative to the surface, and wherein prior to establishment of growth conditions, a mask of passivating material is formed on the substrate surface to inhibit bulk growth.

In a further aspect, the invention provides a structure comprising a substrate having a surface defined by a predetermined crystal facet, and at least one nanowhisker extending from said surface in a direction corresponding to said crystal facet, but not corresponding to a preferential direction of growth for the nanowhisker, and a layer of passivating material disposed on the substrate surface.

In one preferred form, the structure comprises a substrate of III-V semiconductor material having an (001) surface, and at least one nanowhisker extending from said surface in an <001> direction relative to the surface, and a layer of passivating material disposed on the substrate surface.

The mask of passivating material may be silicon oxide or silicon nitride, as described in copending U.S. patent application Ser. No. 10/751,944, filed Jan. 7, 2004 (the entirety of which is incorporated herein by reference). Each catalytic particle may be disposed in a respective aperture within the mask. Alternatively, and as preferred, a layer of carbon containing material can be employed that is deposited over the substrate and the catalytic particles. A particularly preferred material is Lysine (an amino acid). When heated, the material decomposes to leave a thin layer, which may be as thin as a monolayer, of a material that contains carbon and serves to inhibit bulk growth on the substrate. Although the layer coats in addition the catalytic particle, it is so thin that it does not disturb or inhibit nanowhisker growth.

It is preferred to use, as a method of positioning the catalytic particle on the substrate surface, deposition of the particle from an aerosol. A method as described in International Patent Application Publication No. WO 01/84238 (the entirety of which is incorporated herein by reference) may be employed. In the situation where it is desired to use a lithographic process for positioning catalytic particles such as gold on the substrate, it is appropriate to ensure that none of the process steps, such as etching a mask to define positions for the catalytic particles, creates undesirable depressions.

As regards the material of the catalytic particle, this may comprise a non-reactive material such as Au. Alternatively, the Au may be alloyed with a group III material, for example, that forms part of the nanowhisker compound. Alternatively, the particle may be heterogeneous—for example, with one region of Au and another region of group III material. Alternatively, the catalytic particle may be formed wholly of a group III material, such as In.

As regards the material of the nanowhiskers, this need not be the same as that of the substrate and may be of any desired material. When forming semiconductor nanowhiskers on a semiconductor substrate, the material of the whiskers can be of the same semiconductor group as that of the substrate material, or of a different semiconductor group. A specific implementation described hereinafter, and having achieved excellent results, involves InP nanowhiskers grown in an <001> direction on an (001) InP substrate surface.

In addition to III-V materials, substrates of groups IV and II-VI semiconductor materials, and other substrate materials, may be used for nanowhisker growth. Substrates of III-V materials are commonly provided in commerce with (001) surfaces; substrates with (111) surfaces are much more expensive. While specific implementation of the invention is described hereinafter with reference to InP, the invention may also be practiced with GaP and InAs substrates, for example. Substrates of material that contain Ga may have thicker and more resistant oxide formations that should preferably be removed prior to nucleation, without forming a depression in the substrate surface.

Among group IV semiconductor substrate materials, Si is widely used as a substrate material in the manufacture of electronic components. Stable silicon surfaces include (001), (111), and (113). Most electronic components are fabricated on (001) surfaces. Heretofore, nanowhiskers have been grown in the preferential (and oblique) <111> direction from (001) surfaces. In accordance with the techniques of the present invention, however, nanowhiskers can be grown in a direction normal to such surfaces not corresponding to a preferential growth direction—for example, in an <001> direction from an (001) surface.

The present invention is, in principle, applicable to any of the materials that may be used in the manufacture of nanowhiskers and substrates therefor. Such materials are commonly semiconductors formed of Group II through Group VI elements. Such elements include, without limitation, the following:

Group II: Be, Mg, Ca; Zn, Cd, Hg;
Group III: B, Al, Ga, In, Tl;
Group IV: C, Si, Ge, Sn, Pb;
Group V: N, P, As, Sb;
Group VI: O, S, Se, Te.

Semiconductor compounds are commonly formed of two elements to make III-V compounds or II-VI compounds. However, ternary or quaternary compounds are also employed involving, e.g., two elements from Group II or from Group III. Stoichiometric or non-stoichiometric mixtures of elements can be employed.

III-V materials and II-VI materials include, without limitation, the following:

AlN, GaN, SiC, BP, InN, GaP, AlP, AlAs, GaAs, InP, PbS, PbSe, InAs, ZnSe, ZnTe, CdS, CdSe, AlSb, GaSb, SnTe, InSb, HgTe, CdTe, ZnTe, ZnO.

There are many other semiconductor materials to which the invention is applicable: see, for example, "Handbook of Chemistry and Physics"—CRC—Properties of Semiconductors—for a more complete treatment.

In accordance with the invention, a semiconductor substrate may be selected from one of the above group IV, III-V or II-VI materials, and the nanowhiskers may be selected from the same or another of the group IV, III-V or II-VI materials.

BRIEF DESCRIPTION OF THE DRAWINGS

Preferred embodiments of the invention will now be described with reference to the accompanying drawings, wherein.

DESCRIPTION OF THE PREFERRED EMBODIMENTS

In accordance with the present invention, it is has been found that growth of a nanowhisker in a non-preferential direction (e.g., in an <001> direction from an (001) crystal plane) is, once established, stable. The present invention more particularly recognizes the possibility to define and to stabilize the growth direction by controlling conditions at the onset of the nucleation event.

The following discussion describes an exemplary application of the invention to [001] InP nanowhiskers grown by metal-organic vapor phase epitaxy directly on (001) InP substrates. The nanowhiskers were characterized by scanning electron microscopy and transmission electron microscopy and found to have structural characteristics substantially superior to those of comparative whiskers grown in the preferential <111>B direction, as will be discussed in detail below.

The InP nanowhiskers were grown using low-pressure metal-organic vapor phase epitaxy (MOVPE). Aerosol-produced, 50 nm Au-particles were deposited on (001) InP substrates, which were then placed within a horizontal reactor cell on an RF-heated graphite susceptor. A hydrogen carrier gas flow of 6 l/min at a pressure of 100 mBar (10 kPa) was used. A constant phosphine flow at a molar fraction of $1.5\times10^{-2}$ was supplied to the reactor cell and the samples were heated up to 420° C. over 5 minutes. After this temperature ramp step, growth of nanowhiskers was immediately commenced by introducing trimethylindium (TMI) into the reactor cell. The TMI molar fraction was $3\times10^{-6}$, and the typical growth time was 8 minutes. It should be noted that this method of producing whiskers differs from the often-used procedure of whisker growth, where Au particles are annealed at higher temperature prior to whisker growth in order to de-oxidize the surface and alloy the Au catalyst with the semiconductor material. In addition, in order to improve the growth of [001] nanowhiskers in relation to competing bulk growth at the (001) surface, the substrate with the deposited Au particles was dipped into a solution of poly-L-Lysine before inserting it into the growth chamber. L-Lysine (2,6 diaminocaproic acid) is known to be an adhesion-active substance with low vapor pressure. The monohydrate melts under decomposition between 212-214° C., leaving a thin passivation layer at the surface. This layer prevents InP-growth on the bare (001) InP surface.

Figure 1:
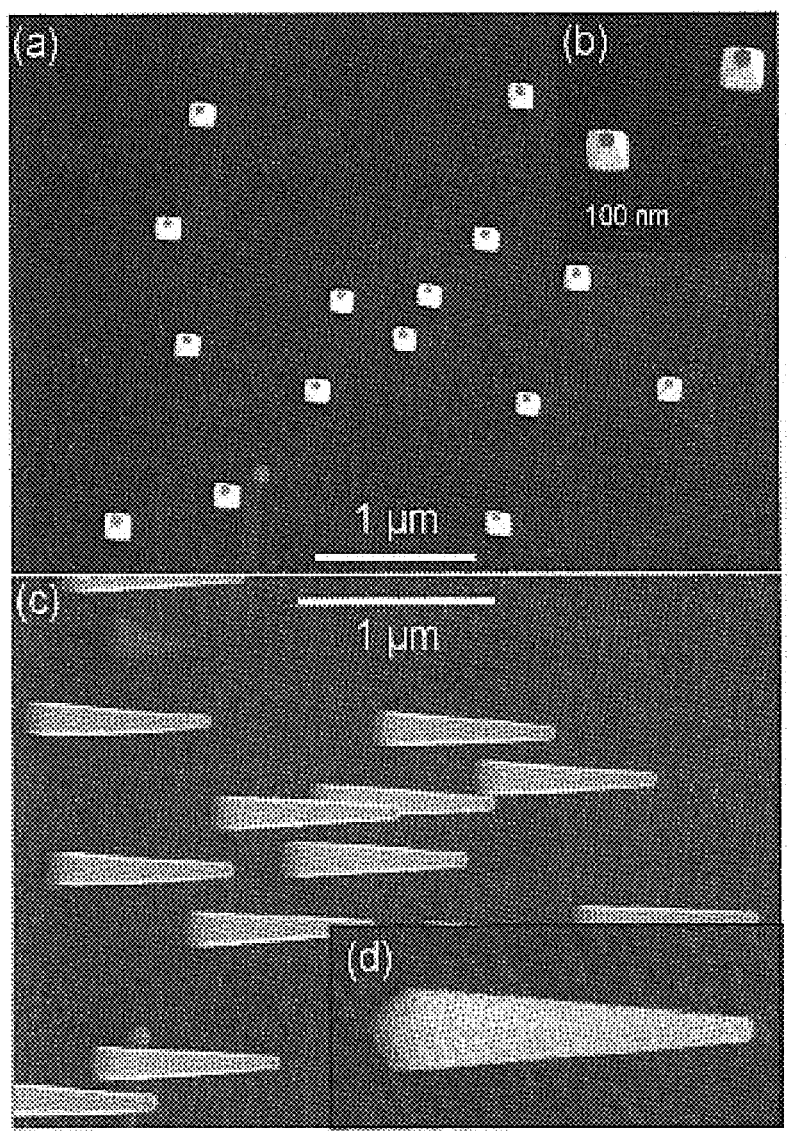
FIGS. 1(a) to 1(d) are SEM-images of InP nanowhiskers on a substrate of InP (001), in accordance with the invention: (a) top-view, (b) enlarged top-view, (c) view on a substrate tilted by 30°, (d) magnification of a single whisker after a clockwise rotation of the substrate by 40°.

Sample characterization was carried out using a JSM 6400 F field emission scanning electron microscope (SEM), operated at 15 kV. FIGS. 1(a) to 1(d) show SEM-images of [001] InP nanowhiskers grown by the procedures described above. FIG. 1(a) is a top view. FIG. 1(b) is an enlarged top view. FIG. 1(c) is view on a substrate tilted by 30°, and FIG. 1(d) shows magnification of a single whisker after a clockwise rotation of the substrate by 40°. In FIG. 1(b), a rectangular whisker shape formed by stepped {110} sidefacets of the [001] oriented whiskers is clearly evident.

Figure 3:
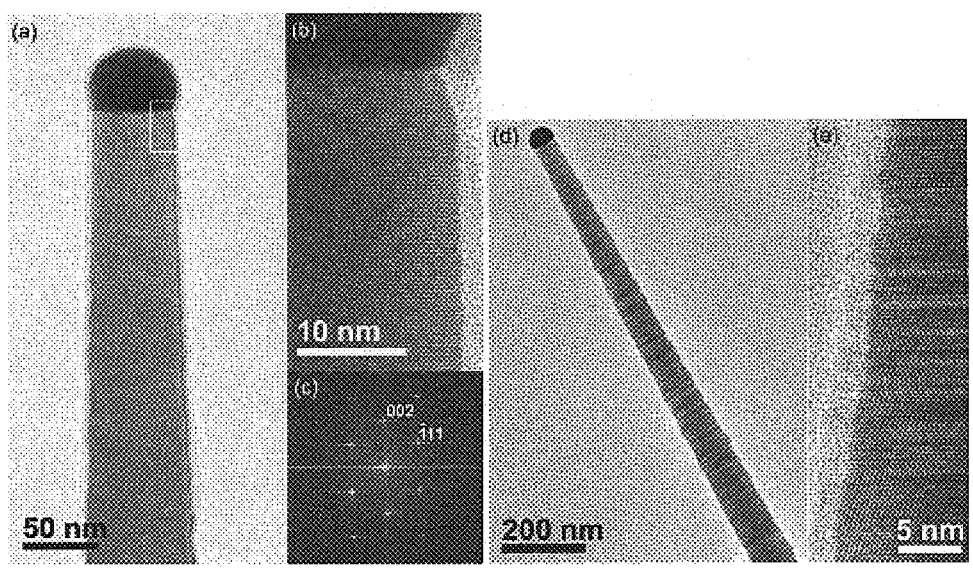
FIGS. 3(a) to 3(e) are TEM-images of InP nanowhiskers to illustrate comparative characteristics of nanowhiskers grown in a non-preferential <001> direction in accordance with the invention relative to nanowhiskers grown in a preferential <111>B direction.

A most remarkable effect of the whisker growth in [001] is the high crystalline perfection observed. FIGS. 3(a) to 3(e) show high-resolution transmission electron microscopy (TEM) images of InP wires grown in [001] and <111>B in comparison. The [001] wires appear to be defect-free, whereas <111>B grown whiskers contain a high concentration of stacking faults. The energetic differences for hexagonal or cubic stacking sequences in <111>B are small, and the stacking faults, as planar defects vertical to the growth direction, can freely end at the nanowhisker side facets. The formation of similar defects during growth in [001] would need to overcome an activation barrier for the creation of Frank partial dislocations. FIG. 3(a) is a side view showing a defect-free [001]-grown nanowhisker. FIG. 3(b) is an enlargement of the boxed area in FIG. 3(a), showing the atomic lattice of the defect-free zincblende structure in a [110] projection. FIG. 3(c) is a Fourier transform of the [110] projection. FIG. 3(d) is a side view showing a conventionally grown <111>B-directed nanowhisker with stacking faults all along the wire. FIG. 3(e) is a close-up of the nanowhisker of FIG. 3(d), showing mirror plane stacking faults resulting in wurtzite-structure segments.

The TEM images of FIGS. 3(a) to 3(e) were taken from nanowhiskers broken off from the substrate by touching a TEM grid to the nanowhisker substrate.

The higher materials perfection for nanowhiskers grown in [001] was also evident in photoluminescence studies. For photoluminescence (PL) studies, nanowhiskers were transferred to a thermally oxidized Si wafer on which a gold pattern was created to facilitate localization and identification of the whiskers studied by PL. The measurements were performed at liquid-He temperatures. A frequency-doubled Nd-YAG laser emitting at 532 nm was used for excitation. The luminescence was collected through an optical microscope, dispersed through a spectrometer, and detected by a liquid-$N_2$ cooled CCD.

Figure 4:
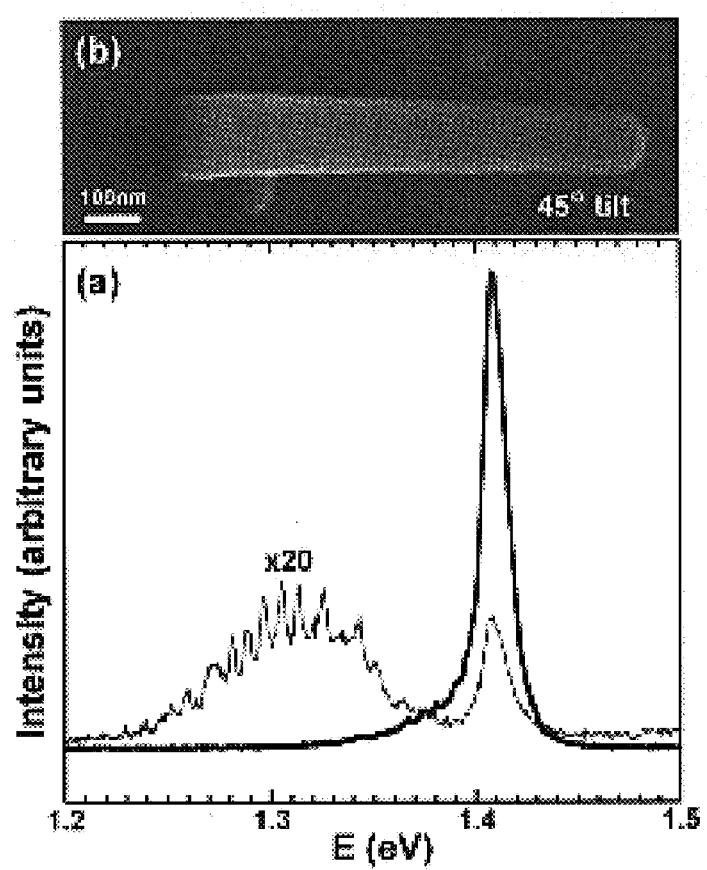
FIG. 4(a) shows photoluminescence spectra from an <001> nanowhisker in accordance with the invention (thick line) and a typical <111>B whisker (thin line)
FIG. 4(b) is an SEM image of the <001> whisker having the photoluminescence spectrum in FIG. 4(a).

Photoluminescence measurements of single [001] InP nanowhiskers grown in accordance with the invention exhibited a narrow and intense emission peak at approximately 1.4 eV, whereas <111>B conventionally grown reference whiskers showed additional broad luminescence peaks at lower energy. FIG. 4(a) shows photoluminescence spectra from an <001> nanowhisker of the invention, with strong bandgap-related luminescence associated with the whisker (thick line) and a typical <111>B whisker with weaker luminescence and an additional broad peak at lower energies (thin line; small peaks superimposed on top of the broad main feature are artifacts resulting from interference within the CCD). FIG. 4(b) shows an SEM image of the <001> whisker, showing the strong PL in FIG. 4(a).

Figure 2:
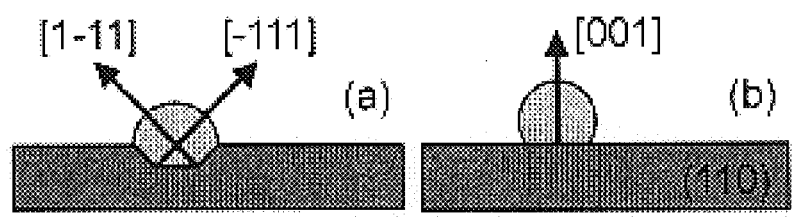
FIGS. 2(a) and 2(b) are schematic diagrams for explaining the invention in terms of different growth directions by different start (nucleation) conditions.

The differences between the situation with and without annealing may be explained by the schematics in FIGS. 2(a) and 2(b). FIG. 2(a) shows growth from an Au-droplet at the (001) surface after annealing. InP will be locally dissolved to form an Au/In alloy, resulting in the formation of a pit. Two side facets within the pit are of {111}B-character. At high temperature (>500° C.), InP will be locally dissolved in a reaction with the Au. Typical Au/semiconductor interfaces, which develop under such conditions within the pit, are the low-energy facets {111}B and {011}, rather than the (001) facet which defines the substrate major surface. Nucleation on such low-energy facets could be the starting point for the commonly observed whisker growth in [1-11] and [-111], as well as the more seldom observed <011> direction reported for GaAs-MBE.

FIG. 2(b) shows growth, in accordance with the invention, from an Au-droplet without annealing. The Au/In-alloy forms by reaction of the Au with TMI, such that the (001) surface underneath the Au-droplet remains essentially intact. Without annealing at higher temperature, the reaction between InP and Au will be suppressed. In and P, dissolved within the Au-droplet, will be mostly from the supply of TMI and $PH_3$ from the vapor phase, and not at the cost of the substrate material. Upon reaching a critical supersaturation, nucleation starts at the InP (001)/Au interface, and, consequently, wire growth can be controlled to occur in the [001] direction. In all samples, areas were found where [001] wires were dominant, but also areas with dominantly <111>B wires. Since slightly misoriented substrates (0.2°) were used, this different behavior may be due to lateral differences in the step structure at the (001) substrate surface.

It will thus be appreciated that the invention can achieve, among other advantages, (1) nano-wires which are highly perfect zincblende crystals that are free of stacking faults, exhibiting intense single-wire luminescence, and (2) the capability of vertical growth on the industrially viable (001) substrate orientation.

The invention claimed is:

1. A method of growing a nanowhisker, comprising: disposing a catalytic particle on a substrate surface, the substrate surface providing a predetermined crystal plane; and growing at least a base portion of a nanowhisker from the catalytic particle in a <001> growth direction that is a non-preferential direction of growth for the nanowhisker, with nucleation conditions at the onset of growth being regulated to control an interface between the catalytic particle and the substrate such that said crystal plane is maintained as said substrate surface at the interface so as to define and stabilize said <001> growth; wherein:
   prior to establishment of growth conditions, a mask of passivating material is formed on the substrate surface to inhibit bulk growth; and
   the mask is a carbon-containing material that is evaporated on the substrate surface to provide a thin layer that contains carbon.

2. A method according to claim 1, wherein conditions are regulated such that nucleation of the nanowhisker is achieved with the catalytic particle having consumed substantially no material from the substrate.

3. A method according to claim 1, wherein conditions are regulated so as to avoid creation of a pit or depression at the interface between the catalytic particle and the substrate.

4. A method according to claim 1, wherein conditions are regulated such that there is not exposed at the interface between the catalytic particle and the substrate, a crystal facet that corresponds to a preferential direction for nanowhisker growth.

5. A method according to claim 1, wherein whisker nucleation is initiated without an initial annealing of the catalytic particle disposed on the substrate surface.

6. A method according to claim 1, wherein said nanowhisker comprises a III-V semiconductor compound.

7. A method according to claim 6, wherein indium is a group III constituent of the semiconductor compound.

8. A method according to claim 6, wherein the step of growing comprises growing by MOVPE.

9. A method according to claim 1, wherein said crystal plane is an (001) plane.

10. A method according to claim 1, wherein the substrate comprises a III-V semiconductor compound.

11. A method according to claim 10, wherein indium is a group III constituent of the semiconductor compound.

12. A method according to claim 1, wherein the mask is formed from an amino acid.

13. A method according to claim 1, wherein said catalytic particle is deposited from an aerosol onto the substrate surface.

14. A method according to claim 1, wherein the catalytic particle is preformed, at least in part, with a constituent element that will form part of the nanowhisker.

15. A method according to claim 1, wherein nanowhisker growth is carried out at a low temperature such as to inhibit substrate material contributing to growth of the nanowhisker.

16. A method of growing a nanowhisker, comprising: providing a catalytic particle on an (001) substrate surface; and establishing growth conditions wherein heat is applied and constituent materials are introduced in gaseous form so as to grow a nanowhisker having at least a base portion of a III-V semiconductor compound from the catalytic particle, wherein nucleation conditions at the onset of growth are regulated such that the base portion of the nanowhisker grows from the substrate surface in an <001> direction.

17. A method according to claim 16, wherein conditions are regulated so as not to create a pit or depression at an interface between the catalytic particle and the substrate.

18. A method according to claim 16, wherein conditions are regulated such that there is not exposed at an interface between the catalytic particle and the substrate, a crystal facet that corresponds to preferential direction for nanowhisker growth.

19. A method according to claim 16, wherein whisker nucleation is initiated without an initial annealing of the catalytic particle disposed on the substrate surface.

20. A method according to claim 16, wherein indium is a group III constituent of the semiconductor compound.

21. A method according to in claim 16, wherein the substrate comprises a III-V semiconductor compound.

22. A method according to claim 21, wherein indium is a group III constituent of the semiconductor compound.

23. A method according to claim 16, wherein the catalytic particle is deposited from an aerosol onto the substrate surface.

24. A method according to claim 16, wherein the catalytic particle is preformed, at least in part, with a constituent element that will form part of the nanowhisker.

25. A method according to claim 16, wherein nanowhisker growth is carried out at a low temperature such as to inhibit substrate material contributing to growth of the nanowhisker.

26. A method of growing a nanowhisker, comprising: providing a substrate having a major surface defined by a predetermined crystal plane; disposing a catalytic particle on the substrate surface; and establishing growth conditions wherein heat is applied and constituent materials are introduced in gaseous form so as to grow at least a base portion of a nanowhisker from the substrate surface via the catalytic particle in a <001> direction that is a non-preferential direction of growth for the nanowhisker, wherein, prior to establishment of growth conditions, a mask of passivating material is formed on the substrate surface to inhibit bulk growth that would compete with growth of the nanowhisker in said <001> direction, and the mask is a carbon containing material that is evaporated on the substrate surface to provide a thin layer that contains carbon.

27. A method according to claim 26, wherein said nanowhisker comprises a III-V semiconductor compound.

28. A method according to claim 27, wherein indium is a group III constituent of the semiconductor compound.

29. A method according to claim 26, wherein the substrate comprises a III-V semiconductor compound.

30. A method according to claim 29, wherein indium is a group III constituent of the semiconductor compound.

31. A method according to claim 26, wherein the mask is formed from an amino acid.

32. A method according to claim 26, wherein the mask is provided after the catalytic particle is disposed on the substrate surface.

33. A method according to claim 26, wherein growth of the nanowhisker is initiated without an immediately prior annealing step.

34. A method according to claim 26, wherein nucleation conditions at the onset of growth are regulated to control an interface between the catalytic particle and the substrate such that said crystal plane is maintained as said substrate surface at the interface so as to define and stabilize said growth direction.

35. A method of growing a nanowhisker, comprising: disposing a catalytic particle on an (001) substrate surface; and establishing growth conditions wherein heat is applied and constituent materials are introduced in gaseous form, so as to grow at least a base portion of a nanowhisker including a III-V semiconductor compound from the catalytic particle in an <001> direction relative to the substrate surface, wherein prior to establishment of growth conditions, a mask of passivating material is formed on the substrate surface to inhibit bulk growth of the semiconductor compound on the substrate surface.

36. A method according to claim 1, wherein the nanowhisker is grown in said predetermined direction over substantially its entire length.

37. A method according to claim 16, wherein said nanowhisker is grown in said <001> direction over substantially its entire length.

38. A method according to claim 26, wherein the nanowhisker is grown in said predetermined direction over substantially its entire length.

39. A method according to claim 35, wherein said nanowhisker is grown in said <001> direction over substantially its entire length.

40. A method comprising: providing a substrate having a major surface defined by a predetermined crystal plane; and growing a nanowhisker from the substrate surface by a MOVPE VLS process such that at least a base portion of the nanowhisker grows in a non-preferential growth direction other than a <111> B direction from the substrate surface, wherein the non-preferential growth direction comprises a direction normal to the substrate surface and the nanowhisker comprises a III-V semiconductor nanowhisker, and wherein the crystal plane comprises an (001) plane and the non-preferential growth direction comprises a <001> direction relative to the substrate surface.

41. The method of claim 1, wherein the <001> growth direction comprises a direction normal to the substrate surface.

42. The method of claim 9, wherein the <001> growth direction comprises a direction normal to the (001) plane.

43. The method of claim 26, wherein the <001> direction comprises a direction normal to the substrate surface.

44. The method of claim 43, wherein the crystal plane comprises an (001) plane.

* * * * *